United States Patent
Lee et al.

(10) Patent No.: US 8,593,867 B2
(45) Date of Patent: Nov. 26, 2013

(54) FLASH MEMORY DEVICE AND READING METHOD THEREOF

(75) Inventors: Jong-hoon Lee, Hwaseong-si (KR); Nam-hee Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 171 days.

(21) Appl. No.: 13/155,462

(22) Filed: Jun. 8, 2011

(65) Prior Publication Data

US 2011/0305087 A1    Dec. 15, 2011

(30) Foreign Application Priority Data

Jun. 9, 2010  (KR) .......................... 10-2010-0054498

(51) Int. Cl.
| | |
|---|---|
| G11C 11/34 | (2006.01) |
| G11C 16/04 | (2006.01) |
| G11C 16/06 | (2006.01) |
| G11C 7/00 | (2006.01) |

(52) U.S. Cl.
USPC .................. 365/185.12; 365/185.25; 365/203

(58) Field of Classification Search
USPC ................................ 365/185.12, 185.25, 203
See application file for complete search history.

(56) References Cited

U.S. PATENT DOCUMENTS

| | | | | |
|---|---|---|---|---|
| 8,305,813 B2* | 11/2012 | Lee | ........................... | 365/185.21 |
| 2007/0223281 A1* | 9/2007 | Park | ........................... | 365/185.22 |
| 2009/0290431 A1* | 11/2009 | Park et al. | ................ | 365/185.25 |
| 2010/0103743 A1* | 4/2010 | Kim et al. | ................ | 365/185.25 |
| 2010/0302867 A1* | 12/2010 | Koo | ........................... | 365/185.25 |

FOREIGN PATENT DOCUMENTS

| | | |
|---|---|---|
| JP | 2000-173280 | 6/2000 |
| JP | 2005-116102 | 4/2005 |
| KR | 10-0655280 A | 12/2004 |

\* cited by examiner

*Primary Examiner* — Ly D Pham
(74) *Attorney, Agent, or Firm* — Volentine & Whitt, PLLC

(57) ABSTRACT

A flash memory device wherein off cell margin is increased by controlling a voltage of a sensing node and a corresponding reading method, wherein the flash memory device includes a memory cell array; a sensing node voltage controller generating a precharge voltage and a sensing node voltage control signal; and a page buffer unit connected to the memory cell array through bit lines and having page buffers. The page buffers include a bit line connection unit connected between a corresponding bit line and a sensing node, that controls a voltage of the sensing node according to the sensing node voltage control signal; a precharge unit which precharges the sensing node according to the precharge voltage responsive to a precharge control signal; and a data input/output unit sensing a voltage level of the sensing node responsive to a latch control signal and outputting the data of the selected memory cell.

15 Claims, 8 Drawing Sheets

FLASH MEMORY DEVICE AND READING METHOD THEREOF

CROSS-REFERENCE TO RELATED APPLICATIONS

A claim of priority under 35 U.S.C. 119 is made to Korean Patent Application No. 10-2010-0054498, filed on Jun. 9, 2010, the disclosure of which is incorporated herein in its entirety by reference.

BACKGROUND

The inventive concepts described herein are equally related to a flash memory device and a reading method thereof, and more particularly, to a flash memory device wherein an off cell margin is increased by controlling a voltage of a sensing node and a reading method of the flash memory device.

A flash memory device is a kind of non-volatile memory device capable of preserving stored data even if power is cut off. The flash memory device may include a sensing node to sense data in a flash memory cell included therein. However, since a loading capacitance of the sensing node is relatively low, a voltage decrease due to off cell leakage is significant, thereby causing a small off cell margin.

SUMMARY

In an example embodiment of the inventive concept, a flash memory device includes a memory cell array having a plurality of memory cells; a sensing node voltage controller configured to generate a precharge voltage and a sensing node voltage control signal; and a page buffer unit connected to the memory cell array through a plurality of bit lines and configured to receive the precharge voltage and the sensing node voltage control signal, the page buffer unit having a plurality of page buffers respectively corresponding to the plurality of bit lines, each of the plurality of page buffers including a bit line connection unit connected between a corresponding bit line and a sensing node, and configured to control a voltage of the sensing node responsive to the sensing node voltage control signal, a precharge unit connected to the sensing node, and configured to precharge the sensing node to the precharge voltage responsive to a precharge control signal, and a data input/output unit configured to determine data of a selected memory cell by sensing the voltage of the sensing node responsive to a latch control signal, and to output the data of the selected memory cell.

According to another example embodiment of the inventive concept, a flash memory device includes a memory cell array having a plurality of memory cells; a sensing node voltage controller configured to generate a precharge voltage and a sensing node voltage control signal; and a page buffer unit connected to the memory cell array through a plurality of bit lines and having a plurality of page buffers, each of the page buffers including a bit line connection unit connected between a corresponding bit line and a sensing node, and configured to control a voltage of the sensing node responsive to the sensing node voltage control signal, a precharge unit connected to the sensing node, and configured to precharge the sensing node to the precharge voltage responsive to a precharge control signal, and a data input/output unit configured to determine data of a memory cell connected to the corresponding bit line by sensing the voltage of the sensing node and to output the data, wherein during a read operation, the sensing node voltage control signal is set to a first voltage in a precharge period, and set to a second voltage after the precharge period to increase the voltage of the sensing node in a data sensing period.

According to another example embodiment of the inventive concept, a flash memory device includes a memory cell array having a plurality of memory cells; a sensing node voltage controller configured to generate a precharge voltage and a sensing node voltage control signal; and a page buffer unit connected to the memory cell array through a plurality of bit lines, and having a plurality of page buffers, each of the page buffers including a bit line connection unit connected between a corresponding bit line and a sensing node, and configured to control a voltage of the sensing node responsive to the sensing node voltage control signal, a precharge unit connected to the sensing node, and configured to precharge the sensing node to the precharge voltage responsive to a precharge control signal, and a data input/output unit configured to determine data of a memory cell connected to the corresponding bit line by sensing the voltage of the sensing node, and to output the data, wherein during a read operation, the precharge voltage is set to be greater than a power supply voltage of the flash memory device in a precharge period prior to a data sensing period.

According to another example embodiment of the inventive concept, there is provided a reading method of a flash memory device including a memory cell array, which has a plurality of memory cells, and a page buffer unit, the method including electrically connecting a bit line connected to a memory cell selected by a word line with a sensing node of the page buffer unit; precharging the sensing node in response to a precharge control signal; and electrically cutting off the bit line connected to the selected memory cell and the sensing node of the page buffer unit and sensing a voltage of the sensing node.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
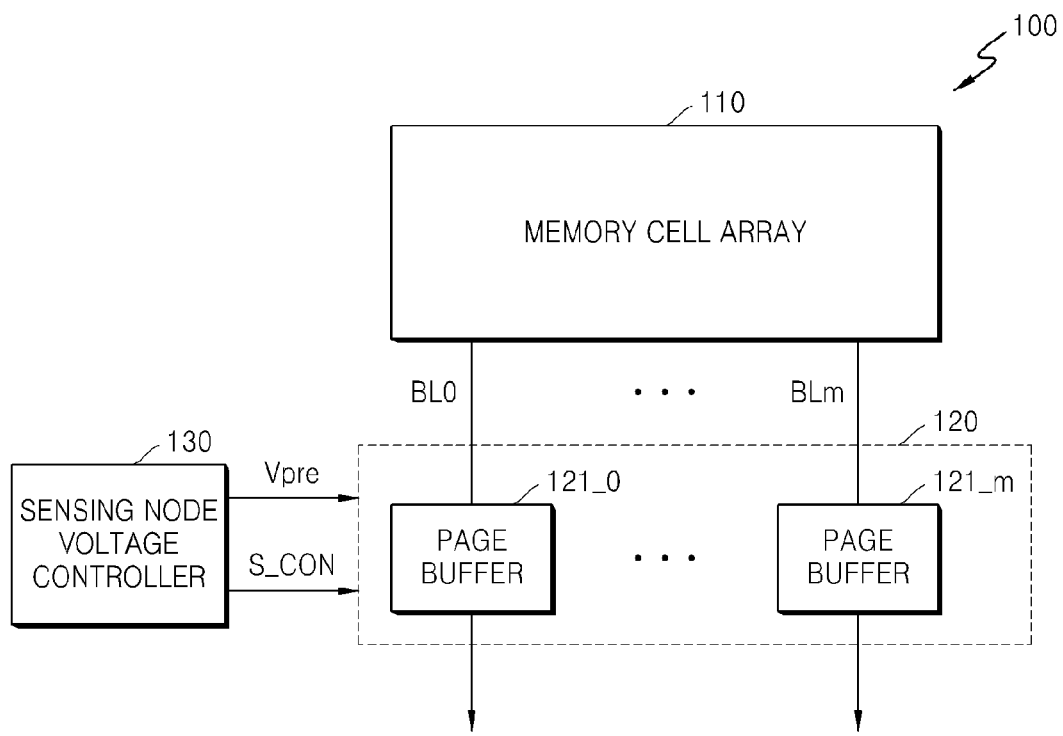
FIG. 1 is a block diagram of a flash memory device according to an example embodiment of the inventive concept.

For the example embodiments of the inventive concept disclosed in the specification, specific structural or functional descriptions are illustrated. The example embodiments of the inventive concept can be embodied with various changes in form and thus should not be construed as limited to the description in the specification.

The inventive concept may allow various kinds of change or modification and various changes in form, and specific example embodiments will be illustrated in drawings and described in detail in the specification. However, it should be understood that the specific example embodiments do not limit the inventive concept to a specific disclosed form, but include every modified, equivalent, or replaced one within the spirit and technical scope of the inventive concept.

Although terms, such as 'first' and 'second', can be used to describe various elements, the elements should not be limited by these terms. The terms can be used to classify a certain element from another element. For example, a first element can be named a second element without departing from the scope of the inventive concept, and the second element can be named the first element.

When it is described that a certain element is 'connected' or 'linked' to another element, it should be understood that the certain element may be connected or linked to another element directly or via another element. In contrast, when a certain element is 'directly connected' or 'directly linked' to another element, it should be understood that any other element does not exist between the elements. Other expressions for describing a relationship between elements, i.e., 'between' and 'directly between' and 'neighboring' and 'directly neighboring', should be understood in the same way.

The terminology used in the application is used only to describe specific example embodiments and does not have any intention to limit the inventive concept. An expression in the singular includes an expression in the plural unless the expressions are clearly different from each other in a context. In the application, it should be understood that terms, such as 'include' and 'have', are used to indicate the existence of an implemented feature, number, step, operation, element, part, or a combination of them without excluding in advance the possibility of existence or addition of one or more other features, numbers, steps, operations, elements, parts, or combinations of them.

All terms used herein including technical or scientific terms have the same meaning as those generally understood by those of ordinary skill in the art unless they are defined differently. It should be understood that terms generally used, which are defined in a dictionary, have the same meaning as in a context of related technology, and the terms are not understood as ideal or as an excessively formal meaning unless they are clearly defined in the application.

The attached drawings for illustrating example embodiments of the inventive concept are referred to in order to gain a sufficient understanding of the inventive concept, the merits thereof, and the objectives accomplished by the implementation of the inventive concept.

Hereinafter, the inventive concept will be described in detail by explaining example embodiments of the inventive concept with reference to the attached drawings. Like reference numerals in the drawings denote like elements.

FIG. 1 is a block diagram of a flash memory device 100 according to an example embodiment of the inventive concept. The flash memory device 100 may include a memory cell array 110, a page buffer unit 120, and a sensing node voltage controller 130.

The memory cell array 110 may include a plurality of memory cells. Since the memory cell array 110 shown in FIG. 1 has a similar configuration and operation to a memory cell array included in a typical flash memory device, a detailed description thereof will be omitted. The memory cell array 110 shown in FIG. 1 can be a NAND flash memory cell array.

The page buffer unit 120 may be connected to the memory cell array 110 through a plurality of bit lines BL0 to BLm. The page buffer unit 120 may include a plurality of page buffers 121_0 to 121_m respectively corresponding to the plurality of bit lines BL0 to BLm.

The sensing node voltage controller 130 may generate a precharge voltage Vpre and a sensing node voltage control signal S_CON, and output the precharge voltage Vpre and the sensing node voltage control signal S_CON to the page buffer unit 120. The sensing node voltage controller 130 may control a voltage of a sensing node of each of the plurality of page buffers 121_0 to 121_m included in the page buffer unit 120 by using the precharge voltage Vpre and the sensing node voltage control signal S_CON. The sensing node voltage controller 130 may be included in a memory controller (not shown) included in the flash memory device 100 according to an example embodiment of the inventive concept.

The memory cell array 110, the page buffer unit 120, and the sensing node voltage controller 130 will be described in more detail with reference to FIG. 2.

Figure 2:
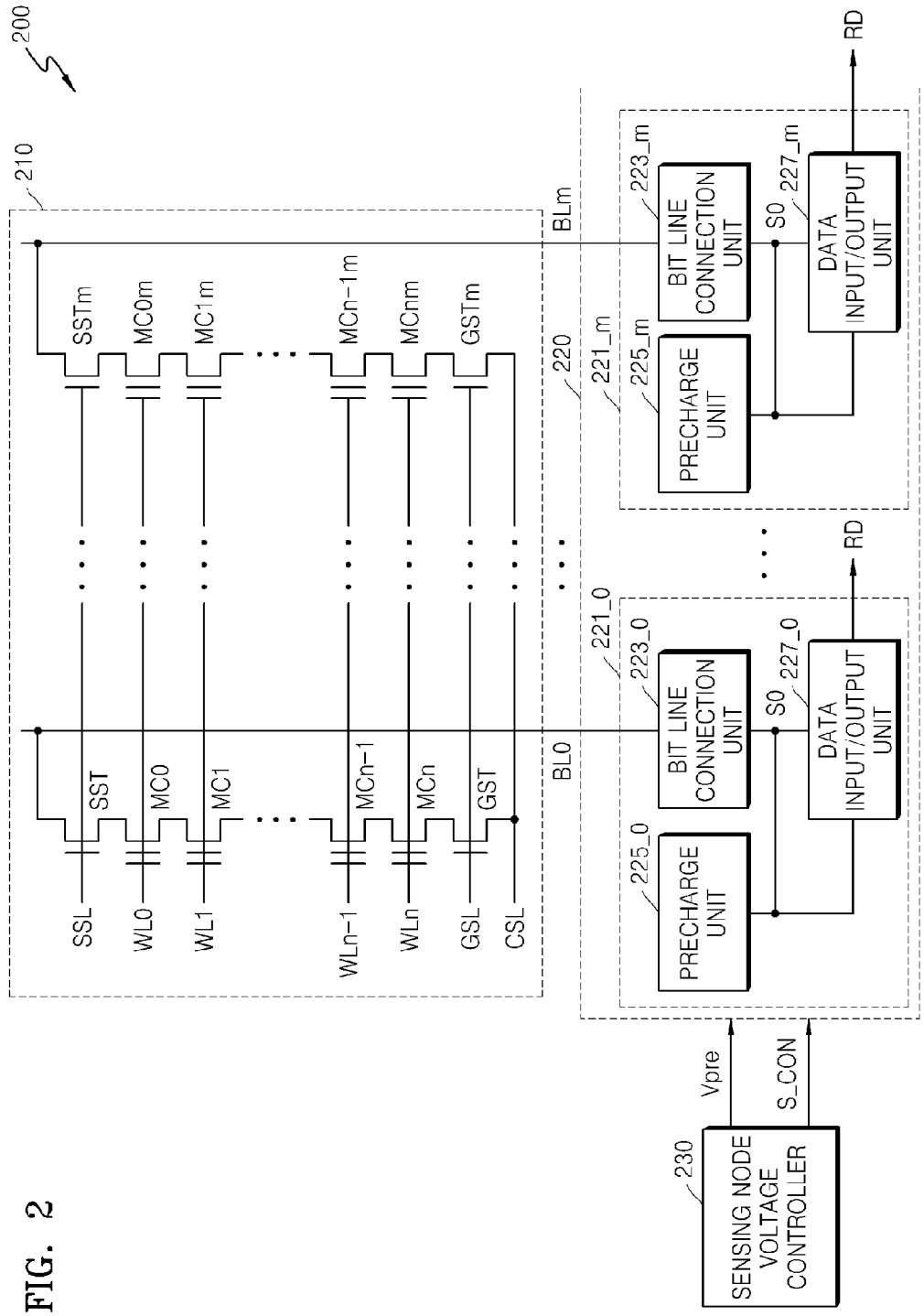
FIG. 2 is a block diagram of an example embodiment of the flash memory device of FIG. 1.

FIG. 2 is a block diagram of an example embodiment of the flash memory device of FIG. 1. Referring to FIG. 2, a flash memory device 200 shown in FIG. 2 may include a memory cell array 210, a page buffer unit 220, and a sensing node voltage controller 230, similar to the flash memory device 100 shown in FIG. 1. The memory cell array 210, the page buffer unit 220, and the sensing node voltage controller 230 shown in FIG. 2 are examples of the memory cell array 110, the page buffer unit 120, and the sensing node voltage controller 130, respectively, shown in FIG. 1.

The memory cell array 210 included in the flash memory device 200 according to an example embodiment of the inventive concept may be a NAND flash memory cell array. Referring to FIG. 2, the memory cell array 210 may include string selection transistors SST to SSTm, a plurality of memory cells MC0 to MCn, . . . , MC0m to MCnm, and ground selection transistors GST to GSTm. The plurality of memory cells MC0 to MCn, . . . , MC0m to MCnm may be connected between the string selection transistors SST to SSTm and the ground selection transistors GST to GSTm, and a control gate of each of the plurality of memory cells MC0 to MCn, . . . , MC0m to MCnm may be connected to corresponding word lines WL0 to WLn.

Drains of the string selection transistors SST to SSTm may be connected to corresponding bit lines BL0 to BLm, and gates of the string selection transistors SST to SSTm may be connected to a string selection line SSL. Also, sources of the ground selection transistors GST to GSTm may be connected to a common source line CSL, and gates of the ground selection transistors GST to GSTm may be connected to a ground selection line GSL. A single string selection transistor SST, a single ground selection transistor GST, and a plurality of memory cells MC0 to MCn connected therebetween may be characterized as a single string. Since a configuration and operation of the memory cell array 210 shown in FIG. 2 should be well understood to those of ordinary skill in the art, detailed description thereof will be omitted.

The page buffer unit 220 shown in FIG. 2 may include a plurality of page buffers 221_0 to 221_m respectively corresponding to the plurality of bit lines BL0 to BLm. The page buffers 221_0 to 221_m may respectively include bit line connection units 223_0 to 223_m, precharge units 225_0 to 225_m, and data input/output units 227_0 to 227_m.

The bit line connection units 223_0 to 223_m may be connected between respective bit lines BL0 to BLm and sensing nodes SO corresponding respectively to the plurality of page buffers 221_0 to 221_m.

The precharge units 225_0 to 225_m may be connected to the respective sensing nodes SO and may precharge the sensing nodes SO in response to a precharge control signal. The precharge control signal may be provided by the aforementioned memory controller (not shown).

The data input/output unit 227_0 to 227_m may read data of a selected memory cell by sensing a voltage level of the respective sensing nodes SO, or may provide data input from the outside to the bit line connection units 223_0 to 223_m through the sensing nodes SO.

A detailed configuration and operation of the bit line connection units 223_0 to 223_m, the precharge units 225_0 to 225_m, and the data input/output units 227_0 to 227_m shown in FIG. 2 will be described in detail with reference to FIGS. 3 and 4.

The sensing node voltage controller 230 shown in FIG. 2 may generate a precharge voltage Vpre and a sensing node voltage control signal S_CON, and output the precharge voltage Vpre and the sensing node voltage control signal S_CON to the page buffer unit 220. The precharge voltage Vpre output from the sensing node voltage controller 230 may be applied to the precharge units 225_0 to 225_m. Accordingly, the precharge units 225_0 to 225_m may precharge the sensing nodes SO to the precharge voltage Vpre in response to the precharge control signal. Also, the sensing node voltage control signal S_CON output from the sensing node voltage controller 230 may be applied to the bit line connection units 223_0 to 223_m. The bit line connection units 223_0 to 223_m may control a voltage of the sensing nodes SO in response to the sensing node voltage control signal S_CON.

The flash memory device 200 according to an exemplary embodiment of the inventive concept shown in FIG. 2 may use a current read method for sensing data of a memory cell, by using a capacitance of a sensing node SO without using a bit line capacitance of which loading is great, in order to sense data of a memory cell at a high speed. However, since the sensing node SO has a low loading capacitance unlike the bit line BL0 to BLm, a voltage decrease due to off cell leakage is significant, thereby causing a small off cell margin.

Thus, the flash memory device 200 according to an example embodiment of the inventive concept shown in FIG. 2 may increase an off cell margin in a reading operation of a memory cell by controlling a voltage of the sensing node SO included in the page buffer 221_0 to 221_m.

For example, the flash memory device 200 according to an example embodiment of the inventive concept may increase a gate voltage of a transistor connected to the sensing node SO in response to the sensing node voltage control signal S_CON before sensing data of a memory cell selected by a word line, whereby this happens after finishing precharging of the sensing node SO in a memory cell data reading operation. Accordingly, the off cell margin may be increased by increasing a voltage of the sensing node SO by using a gate capacitance of the transistor connected to the sensing node SO. This will be described in detail with reference to FIG. 5.

As another example, the flash memory device 200 according to an example embodiment of the inventive concept may increase the off cell margin by precharging the voltage of the sensing node SO to a higher voltage than a power supply voltage VDD, instead of precharging to the power supply voltage VDD. That is, the precharge voltage Vpre input from the sensing node voltage controller 230 to the precharge units 225_0 to 225_m may be higher than the power supply voltage VDD. Accordingly, in the memory cell data reading operation, the precharge units 225_0 to 225_m may precharge the voltage of the sensing nodes SO to a higher voltage than the power supply voltage VDD applied to the bit line connection units 223_0 to 223_m. In this case, since the difference between the voltage of the sensing node SO and a voltage of the bit line BL0 to BLm increases before sensing data of a memory cell, the off cell margin may be increased. This will be described in detail with reference to FIG. 6. Meanwhile, the precharge voltage Vpre output from the sensing node voltage controller 230 may be applied from a high voltage generator (not shown) included in the flash memory device 100 or 200 to the sensing node voltage controller 230.

Figure 3:
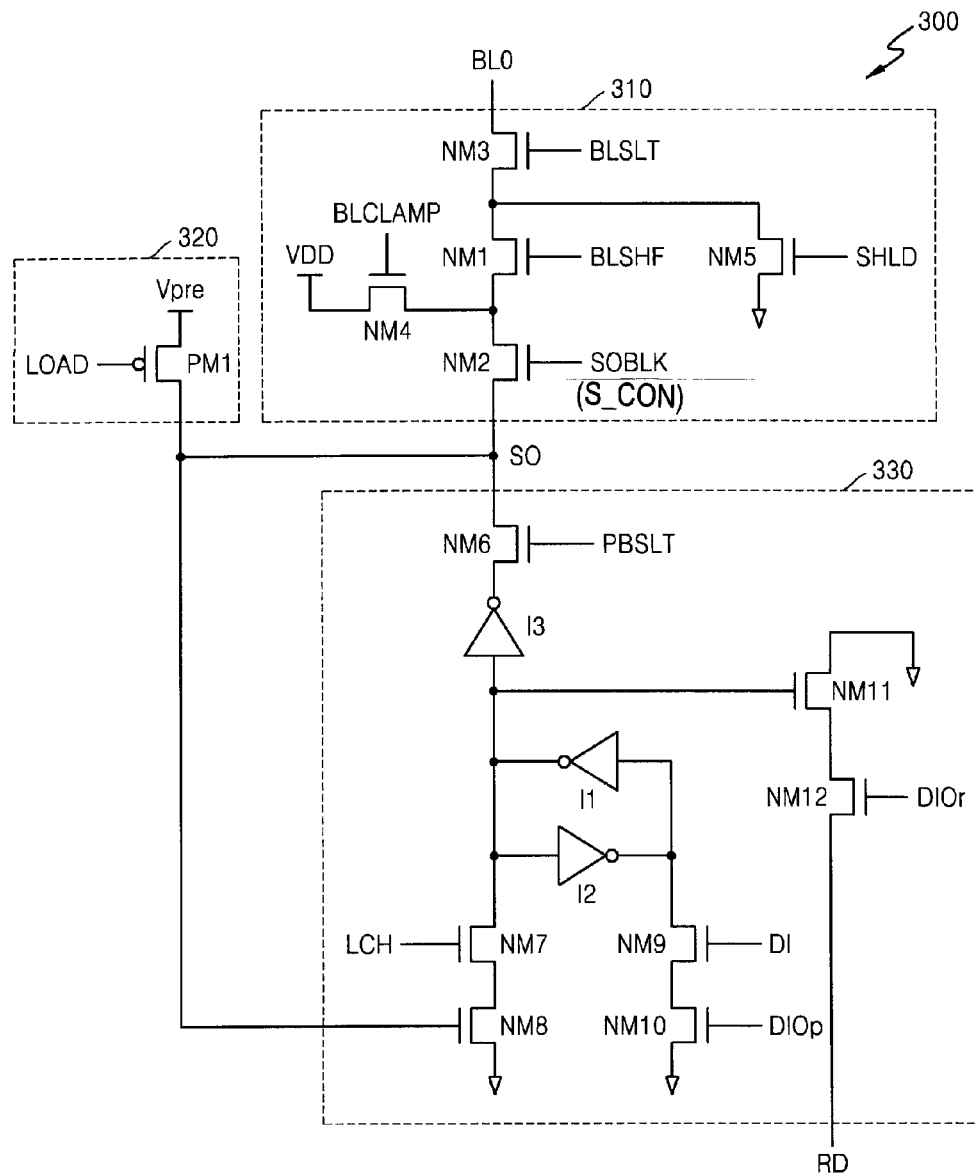
FIG. 3 is a circuit diagram of a first example embodiment of a page buffer of FIG. 2.

FIG. 3 is a circuit diagram of a first example embodiment of a page buffer of FIG. 2. Referring to FIG. 3, a page buffer 300 may include a bit line connection unit 310, a precharge unit 320, and a data input/output unit 330. The bit line connection unit 310, the precharge unit 320, and the data input/output unit 330 shown in FIG. 3 may be embodiments of the bit line connection units 223_0 to 223_m, the precharge units 225_0 to 225_m, and the data input/output units 227_0 to 227_m shown in FIG. 2.

Referring to FIG. 3, the bit line connection unit 310 may include first to third transistors NM1, NM2, and NM3 connected in serial between a bit line BL0 and a sensing node SO. An ON or OFF state of the first transistor NM1 may be controlled by a first control signal BLSHF, an ON or OFF state of the second transistor NM2 may be controlled by a second control signal SOBLK, and an ON or OFF state of the third transistor NM3 may be controlled by a third control signal BLSLT. The third transistor NM3 directly connected to the bit line BL0 may be a high voltage transistor.

The bit line connection unit 310 may further include fourth and fifth transistors NM4 and NM5. An ON or OFF state of the fourth transistor NM4 may be controlled by a fourth control signal BLCLAMP, and the fourth transistor NM4 may be connected between a power supply voltage VDD and a node at which the first transistor NM1 and the second transistor NM2 are connected to each other. An ON or OFF state of the fifth transistor NM5 may be controlled by a fifth control signal SHLD, and the fifth transistor NM5 may be connected between a ground voltage and a node at which the first transistor NM1 and the third transistor NM3 are connected to each other.

The third control signal BLSLT may be active when the corresponding bit line BL0 is selected in a memory cell data reading operation. The third transistor NM3 may be turned on in response to the activation of the third control signal BLSLT. The fourth control signal BLCLAMP and the fifth control signal SHLD may control the fourth transistor NM4 and the fifth transistor NM5, respectively, to control a voltage of the bit line BL0. Since operations of the third control signal BLSLT, the fourth control signal BLCLAMP, and the fifth control signal SHLD should be well understood to those of ordinary skill in the art, a detailed description thereof will be omitted here. Operations of the first control signal BLSHF and the second control signal SOBLK will be described in detail with reference to FIGS. 5 and 6.

The page buffer 300 according to an example embodiment of the inventive concept may boost a gate voltage of the second transistor NM2 directly connected to the sensing node SO after finishing precharge of the sensing node SO in the memory cell data reading operation. Here, the second control signal SOBLK applied to a gate of the second transistor NM2 may be included in the sensing node voltage control signal S_CON input from the sensing node voltage controller 230 to the bit line connection unit 310.

The second control signal SOBLK may have a first power supply voltage value while precharging the sensing node SO and have a second power supply voltage value greater than the first power supply voltage value after finishing the precharge of the sensing node SO. Accordingly, the off cell margin can be increased by increasing the voltage of the sensing node SO according to a gate capacitance of the second transistor NM2. This will be described in detail with reference to FIG. 5.

Referring to FIG. 3, the precharge unit 320 may include a precharge transistor PM1. The precharge voltage Vpre may be applied to a first terminal of the precharge transistor PM1, the sensing node SO may be connected to a second terminal of the precharge transistor PM1, and a precharge control signal LOAD may be applied to a gate terminal of the precharge transistor PM1. As described above, the precharge voltage Vpre may be applied from the sensing node voltage controller 230 to the precharge unit 320. The precharge unit 320 may precharge the sensing node SO to the precharge voltage Vpre in response to activation of the precharge control signal LOAD. The precharge voltage Vpre shown in FIG. 3 may be a typical power supply voltage VDD applied to the page buffer 300.

Referring to FIG. 3, the data input/output unit 330 may include sixth to twelfth transistors NM6 to NM12 and first to third inverters I1, I2, and I3. The data input/output unit 330 may include a latch unit consisting of inverters I1 and I2 for storing therein data of a memory cell selected by sensing a voltage level of the sensing node SO in response to a latch control signal LCH. The first inverter I1 and the second inverter I2 may form the latch unit by being connected in a chain form. The selected memory cell may mean a memory cell selected by the word lines WL0 to WLm from among the plurality of memory cells MC0 to MCn, . . . , MC0m to MCnm included in the memory cell array 210.

The data stored in the latch unit consisting of inverters I1 and I2 of the data input/output unit 330 may be output to the outside through a data output line RD in response to an input/output control signal DIOr. Since the data input/output unit 330 should be well understood to those of ordinary skill in the art as a general element included in a page buffer of a flash memory device, detailed description of the sixth to twelfth transistors NM6 to NM12 and the first to third inverters I1, I2, and I3 is omitted.

Figure 4:
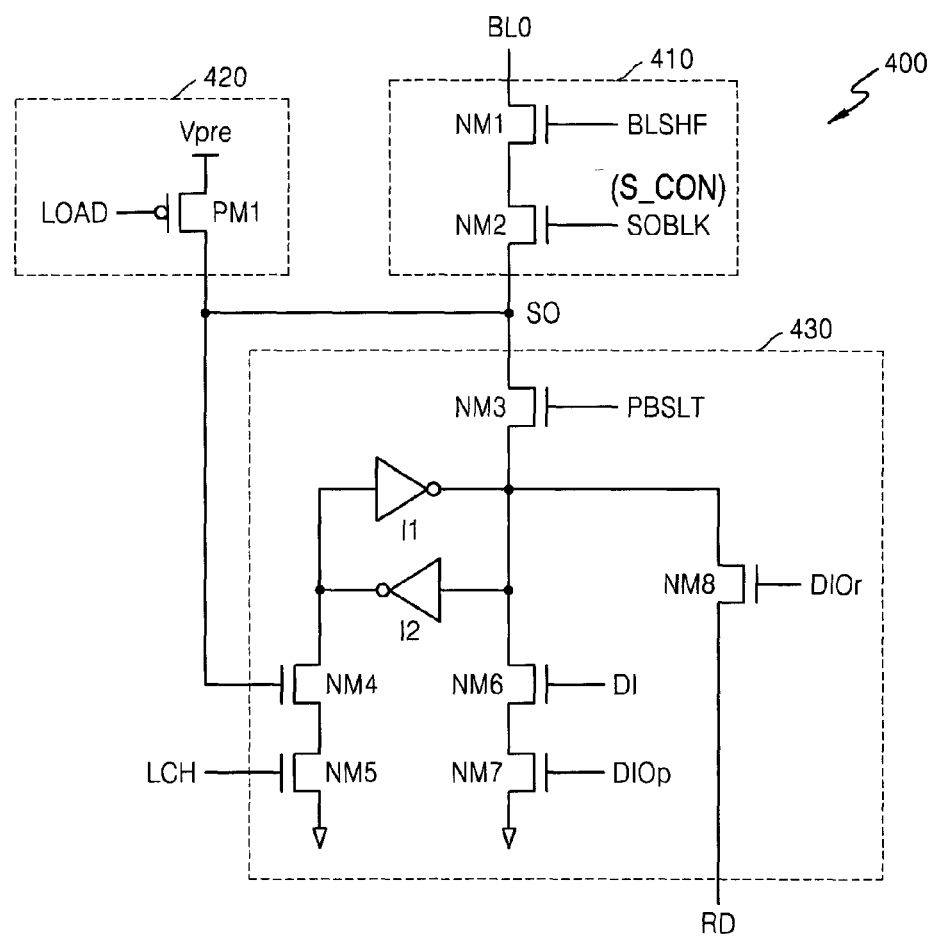
FIG. 4 is a circuit diagram of a second example embodiment of the page buffer of FIG. 2.

FIG. 4 is a circuit diagram of a second example embodiment of a page buffer of FIG. 2. Referring to FIG. 4, a page buffer 400 may include a bit line connection unit 410, a precharge unit 420, and a data input/output unit 430. The bit line connection unit 410, the precharge unit 420, and the data input/output unit 430 shown in FIG. 4 may be embodiments of the bit line connection units 223_0 to 223_m, the precharge units 225_0 to 225_m, and the data input/output units 227_0 to 227_m shown in FIG. 2.

Referring to FIG. 4, the bit line connection unit 410 may include first and second transistors NM1 and NM2 connected in serial between a bit line BL0 and a sensing node SO. An ON or OFF state of the first transistor NM1 may be controlled by a first control signal BLSHF, and an ON or OFF state of the second transistor NM2 may be controlled by a second control signal SOBLK. The first transistor NM1 directly connected to the bit line BL0 may be a high voltage transistor.

Unlike the page buffer 300 according to the example embodiment of the inventive concept shown in FIG. 3, the page buffer 400 according to the example embodiment shown in FIG. 4 may unboost a gate voltage of the second transistor NM2 directly connected to the sensing node SO after a precharge operation of the sensing node SO in the memory cell data reading operation. That is, the second control signal SOBLK may have the same voltage value as when the precharge of the sensing node SO is being performed, even after finishing the precharge of the sensing node SO. This will be described in detail with reference to FIG. 6. The second control signal SOBLK may be included in the sensing node voltage control signal S_CON input from the sensing node voltage controller 230 to the bit line connection unit 410.

Referring to FIG. 4, the precharge unit 420 may include a precharge transistor PM1. The precharge voltage Vpre may be applied to a first terminal of the precharge transistor PM1, the sensing node SO may be connected to a second terminal of the precharge transistor PM1, and a precharge control signal LOAD may be applied to a gate terminal of the precharge transistor PM1. As described above, the precharge voltage Vpre may be applied from the sensing node voltage controller 230 to the precharge unit 420. The precharge unit 420 may precharge the sensing node SO to the precharge voltage Vpre in response to activation of the precharge control signal LOAD. The precharge voltage Vpre shown in FIG. 4 may be a high voltage higher than the typical power supply voltage VDD applied to the page buffer 300. In this case, the precharge voltage Vpre may be applied from a high voltage generation circuit (not shown) included in the flash memory device 100 or 200 to the sensing node voltage controller 230.

When the precharge voltage Vpre shown in FIG. 4 is a high voltage, the page buffer 400 according to the example embodiment of the inventive concept may precharge a voltage of the sensing node SO to a higher voltage than the power supply voltage VDD, thereby increasing the off cell margin when sensing data of a memory cell. In this case, since a difference between the voltage of the sensing nodes SO and a voltage of the bit lines BL0 to BLm increases before sensing the data of the memory cell, the off cell margin can be increased. This will be described in detail with reference to FIG. 6.

Referring to FIG. 4, the data input/output unit 430 may include third to eighth transistors NM3 to NM8 and first and second inverters I1 and I2. The data input/output unit 430 may include a latch unit consisting of inverters I1 and I2 for storing therein data of a memory cell selected by sensing a voltage level of the sensing node SO in response to a latch control signal LCH. The first inverter I1 and the second inverter I2 may form the latch unit by being connected in a chain form. The selected memory cell may mean a memory cell selected by the word line WL0 to WLm from among the plurality of memory cells MC0 to MCn, . . . , MC0m to MCnm included in the memory cell array 210.

The data stored in the latch unit consisting of inverters I1 and I2 of the data input/output unit 430 may be output to the outside through a data output line RD in response to an input/output control signal DIOr. Since the data input/output unit 430 should be well understood to those of ordinary skill in the art as a general element included in a page buffer of a flash memory device, detailed description of the third to eighth transistors NM3 to NM8 and the first and second inverters I1 and I2 is omitted.

Meanwhile, although configurations of the bit line connection units 310 and 410, the precharge units 320 and 420, and the data input/output units 330 and 430 included in the page buffers 300 and 400 according to example embodiments of the inventive concept are disclosed in FIG. 3 and FIG. 4, respectively, the configurations are only examples, and the bit line connection units 310 and 410, the precharge units 320 and 420, and the data input/output units 330 and 430 can be variously changed.

In addition, although it is assumed that the precharge voltage Vpre shown in FIG. 3 is the power supply voltage VDD and the precharge voltage Vpre shown in FIG. 4 is a higher voltage than the power supply voltage VDD, the precharge voltage Vpre applied to the precharge units 320 and 420 included in the page buffers 300 and 400 according to example embodiments of the inventive concept are not limited thereto.

Figure 5:
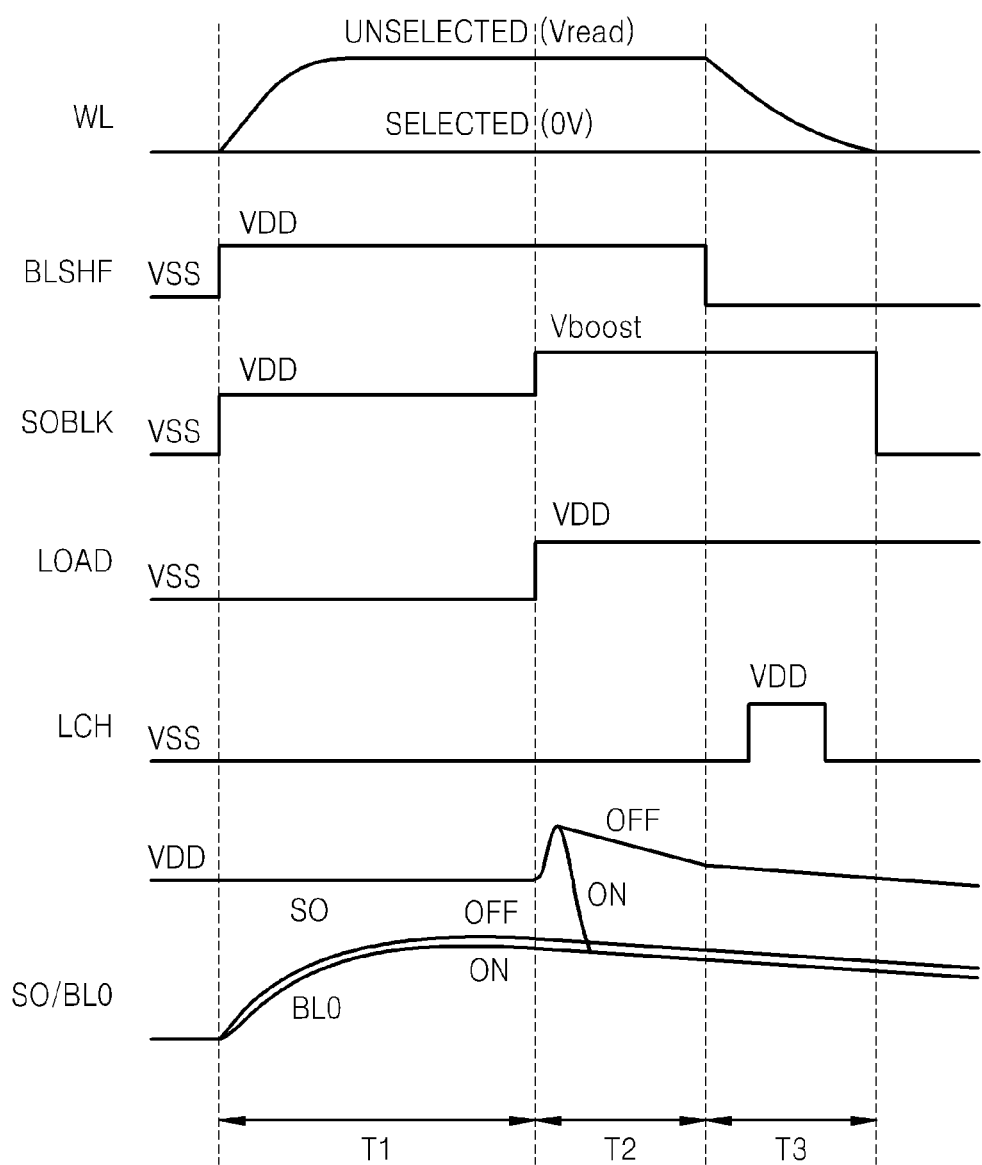
FIG. 5 is a timing diagram illustrating a first example embodiment of a reading operation of a flash memory device according to the inventive concept.

FIG. 5 is a timing diagram illustrating a first example embodiment of a reading operation of a flash memory device according to an example embodiment of the inventive concept. Referring to FIG. 5, the flash memory device 100 or 200 according to an example embodiment of the inventive concept can undergo a precharge period T1, a data sensing period T2, and a latch period T3 in this order when reading data of a memory cell. It is assumed in the first example embodiment of the reading operation of the flash memory device according to FIG. 5 that the precharge voltage Vpre applied to the precharge unit 320 is the power supply voltage VDD.

For a word line voltage WL for the reading operation of the flash memory device, 0V may be applied to a word line corresponding to a selected memory cell and a read voltage Vread may be applied to a word line corresponding to a non-selected memory cell. Since a word line voltage change in the reading operation of the flash memory device should be well understood to those of ordinary skill in the art, a detailed description thereof is omitted.

First, since the precharge control signal LOAD has a value of a ground voltage VSS in the precharge period T1, the precharge transistor PM1 is turned on. Accordingly, the precharge unit 320 may precharge the sensing node SO to the power supply voltage VDD.

In addition, since the first control signal BLSHF and the second control signal SOBLK become active to the power supply voltage VDD, both the first and second transistors NM1 and NM2 are turned on. Although not shown in FIG. 5, the third transistor NM3 of FIG. 3 is also turned on in response to activation of the third control signal BLSLT to read data of a memory cell. Accordingly, a voltage of the bit line BL0 also gradually increases to approach a voltage of the sensing node SO.

In the precharge period T1, due to a characteristic difference between a case where a flash memory cell selected by a word line is an on cell and a case where a flash memory cell selected by a word line is an off cell, a voltage difference having a relatively small magnitude may exist between a voltage of the bit line BL0 of the case where a memory cell selected by a word line is an on cell and a voltage of the bit line BL0 of the case where a memory cell selected by a word line is an off cell.

Next, in the data sensing period T2, a voltage level of the second control signal SOBLK may increase to a boosting voltage Vboost higher than the power supply voltage VDD. That is, the second control signal SOBLK may have a value of the power supply voltage VDD in the precharge period T1 in which the sensing node SO is precharged and have a value of the boosting voltage Vboost greater than the power supply voltage value after finishing the precharge of the sensing node SO.

As described above, the second control signal SOBLK is applied to the gate of the second transistor NM2 directly connected to the sensing node SO. Therefore, when the second control signal SOBLK increases to the boosting voltage Vboost in the data sensing period T2, a voltage of the sensing node SO may also increase in a starting point of the data sensing period T2 as shown in FIG. 5, due to a gate capacitance of the second transistor NM2 directly connected to the sensing node SO.

However, in the data sensing period T2, since the precharge control signal LOAD transitions to the power supply voltage VDD, the precharge transistor PM1 is turned off. Accordingly, the precharge unit 320 does not precharge the sensing node SO to the power supply voltage VDD anymore. Therefore, since the precharge control signal LOAD transitions to the power supply voltage VDD in the data sensing period T2, the voltage of the sensing node SO increased according to a voltage value increase of the second control signal SOBLK may decrease according to data of a memory cell selected by a word line.

In other words, the voltage of the sensing node SO may rapidly decrease to the voltage of the bit line BL0 when a memory cell selected by a word line is an on cell and slowly decrease due to off cell leakage when a memory cell selected by a word line is an off cell.

Finally, in the latch period T3, since the first control signal BLSHF becomes inactive to the ground voltage VSS, the first transistor NM1 is turned off, thereby electrically disconnecting the bit line BL0 from the sensing node SO. Thereafter, the data input/output unit 330 or 430 may store data of a memory cell selected by a word line in the latch unit consisting of inverters I1 and I2 by sensing the voltage level of the sensing node SO in response to activation of the latch control signal LCH. The data stored in the latch unit consisting of inverters I1 and I2 may be output to the outside through the data output line RD in response to the input/output control signal DIOr.

As a result, as described above with reference to FIG. 5, the flash memory device 100 or 200 according to an example embodiment of the inventive concept can increase the off cell margin by increasing a voltage of the sensing node SO to the boosting voltage Vboost after the precharge period T1, to thus prevent incorrectly sensing an off cell as an on cell due to the off cell leakage.

Figure 6:
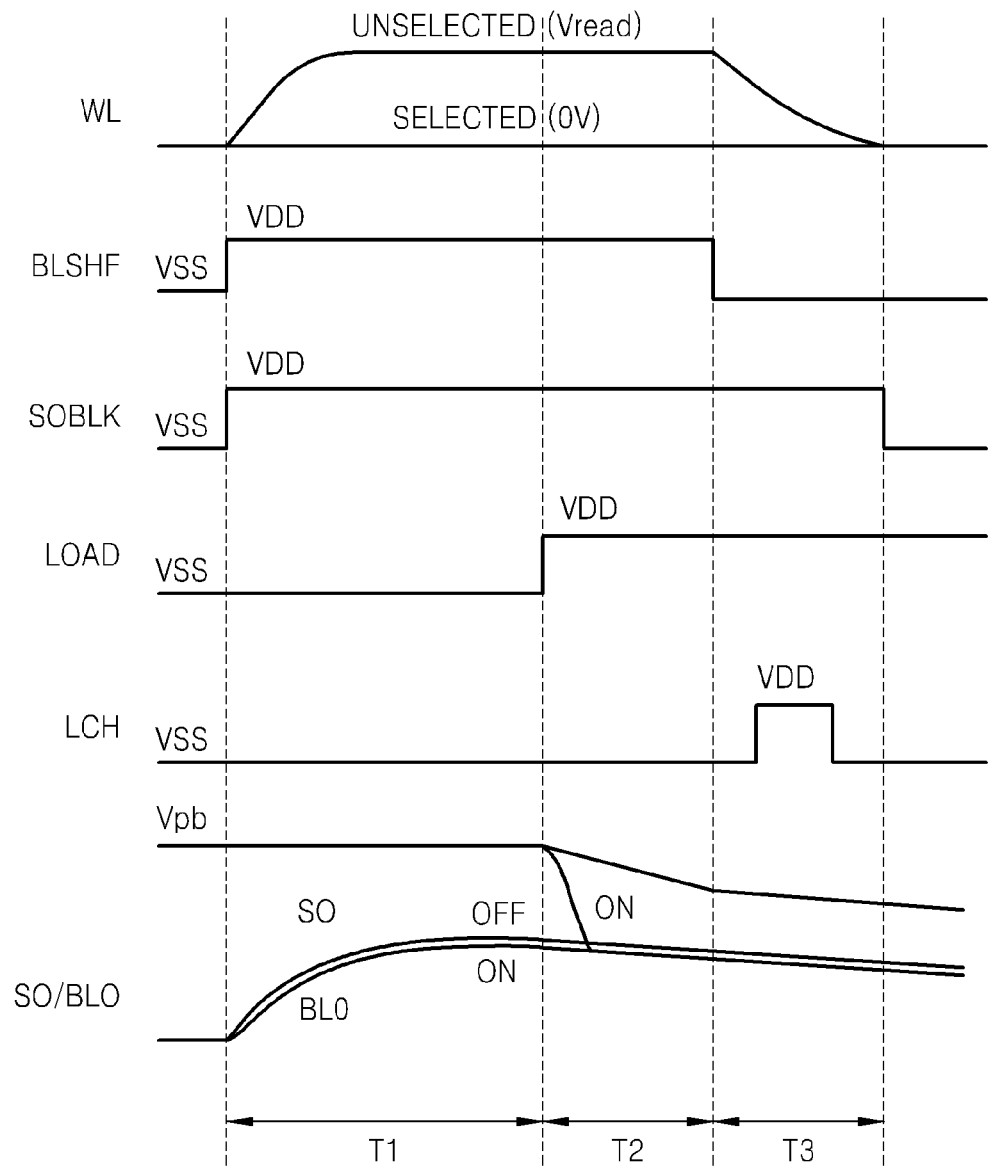
FIG. 6 is a timing diagram illustrating a second example embodiment of a reading operation of a flash memory device according to the inventive concept.

FIG. 6 is a timing diagram illustrating a second example embodiment of a reading operation of a flash memory device according to an example embodiment of the inventive concept. Referring to FIG. 6, the flash memory device 100 or 200 according to an example embodiment of the inventive concept may undergo the precharge period T1, the data sensing period T2, and the latch period T3 in this order when reading data of a memory cell.

Compared to the first example embodiment of the reading operation of the flash memory device according to FIG. 5, in the second example embodiment of the reading operation of the flash memory device according to FIG. 6, the second control signal SOBLK keeps the power supply voltage VDD in the data sensing period T2 without increasing to the boosting voltage Vboost. In addition, it is assumed in the second example embodiment of the reading operation of the flash memory device according to FIG. 6 that the precharge voltage Vpre applied to the precharge unit 420 shown in FIG. 4 is a high voltage Vpb higher than the power supply voltage VDD.

The second example embodiment of the reading operation of the flash memory device according to an example embodiment of the inventive concept will now be described in detail with reference to FIG. 6

First, since the precharge control signal LOAD has a value of the ground voltage VSS in the precharge period T1, the precharge transistor PM1 is turned on. Since the precharge voltage Vpre applied to the precharge unit 420 is the high voltage Vpb higher than the power supply voltage VDD, the precharge unit 420 may precharge the sensing node SO to the high voltage Vpb.

Next, in the data sensing period T2, since the precharge control signal LOAD transitions to the power supply voltage VDD, the precharge transistor PM1 is turned off Accordingly, the precharge unit 420 does not precharge the sensing node SO to the high voltage Vpb anymore. Therefore, the voltage of the sensing node SO in the data sensing period T2 may decrease according to data of a memory cell selected by a word line.

In other words, as shown in FIG. 6, the voltage of the sensing node SO may rapidly decrease to the voltage of the bit line BL0 when a memory cell selected by a word line is an on cell and slowly decrease due to off cell leakage when a memory cell selected by a word line is an off cell.

Finally, since an operation in the latch period T3 is similar to that in the latch period T3 described with reference to FIG. 5, detailed description thereof is omitted.

As a result, referring to FIG. 6, the flash memory device 100 or 200 according to an example embodiment of the inventive concept can increase the off cell margin in sensing of memory cell data by precharging a voltage of the sensing node SO to the high voltage Vpb instead of to the power supply voltage VDD, to thus prevent incorrectly sensing an off cell as an on cell due to the off cell leakage.

Figure 7:
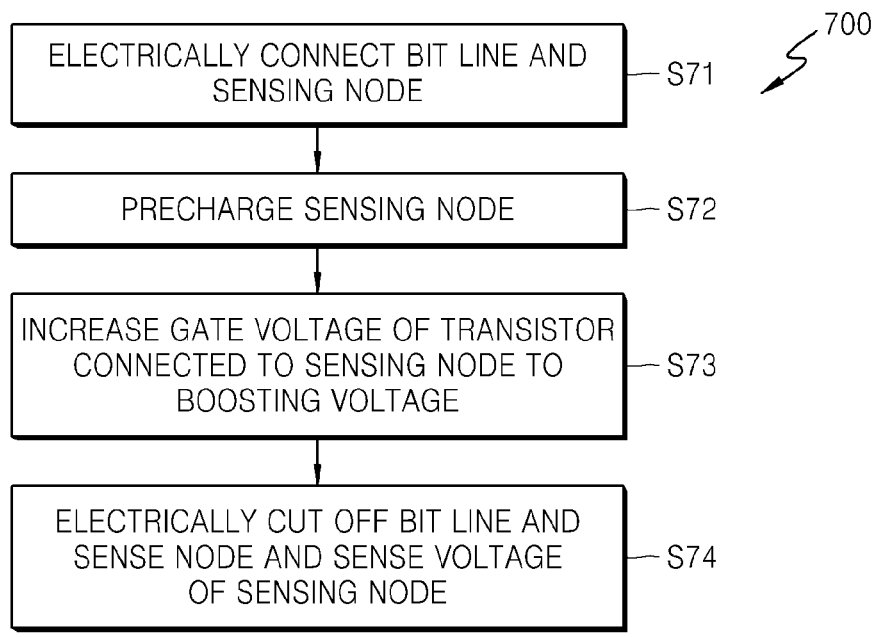
FIG. 7 is a flowchart illustrating a method of reading a flash memory device according to an example embodiment of the inventive concept.

FIG. 7 is a flowchart of a reading method 700 of a flash memory device according to an example embodiment of the inventive concept. Referring to FIG. 7, the reading method 700 of a flash memory device may include: electrically connecting a bit line connected to a memory cell selected by a word line and a sensing node of a page buffer unit (step S71); precharging the sensing node in response to a precharge control signal (step S72); increasing a gate voltage of a transistor connected to the sensing node to a boosting voltage (step S73); and electrically cutting off the bit line connected to the selected memory cell and the sensing node of the page buffer unit, and sensing a voltage of the sensing node (step S74).

Herein, the boosting voltage may have a value greater than that of the gate voltage of the transistor connected to the sensing node in the step of precharging the sensing node. That is, a power supply voltage is applied in a precharge period and the boosting voltage is applied in a data sensing period to a gate terminal of the transistor connected to the sensing node, wherein the boosting voltage may have a value greater than that of the power supply voltage. Meanwhile, the transistor connected to the sensing node may be disposed between the bit line connected to the selected memory cell and the sensing node of the page buffer unit.

In addition, the reading method 700 of a flash memory device may further include: storing data of the selected memory cell by sensing a voltage level of the sensing node in response to a latch control signal; and outputting the data of the selected memory cell to the outside in response to an input/output control signal.

Figure 8:
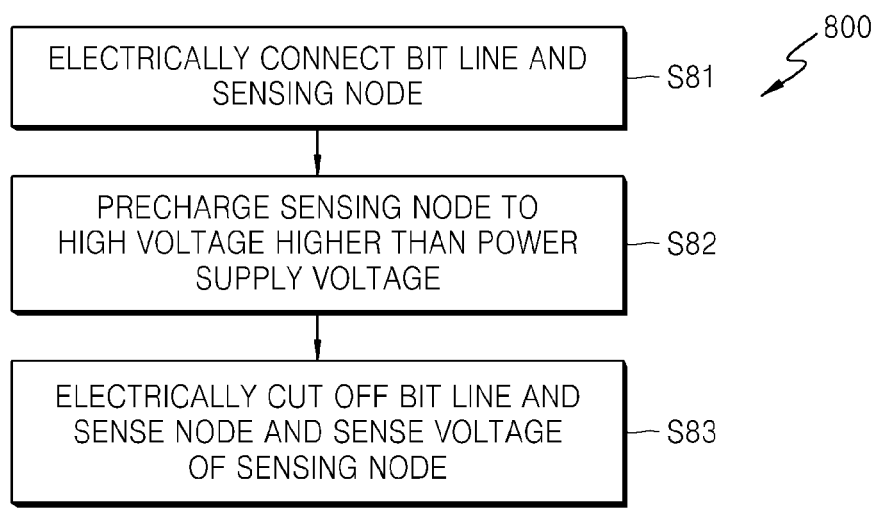
FIG. 8 is a flowchart illustrating a method of reading a flash memory device according to another example embodiment of the inventive concept.

FIG. 8 is a flowchart of a reading method 800 of a flash memory device according to another example embodiment of the inventive concept. Referring to FIG. 8, the reading method 800 of a flash memory device may include: electrically connecting a bit line connected to a memory cell selected by a word line and a sensing node of a page buffer unit (step S81); precharging the sensing node to a high voltage higher than a power supply voltage in response to a precharge control signal (step S82); and electrically cutting off the bit line connected to the selected memory cell and the sensing node of the page buffer unit and sensing a voltage of the sensing node (step S83).

In addition, the reading method 800 of a flash memory device may further include: storing data of the selected memory cell by sensing a voltage level of the sensing node in response to a latch control signal; and outputting the data of the selected memory cell to the outside in response to an input/output control signal.

Since description regarding the reading methods of a flash memory device according to an example embodiment of the inventive concept shown in FIGS. 7 and 8 is similar to that described with reference to FIGS. 1 to 6, detailed description thereof is omitted.

Figure 9:
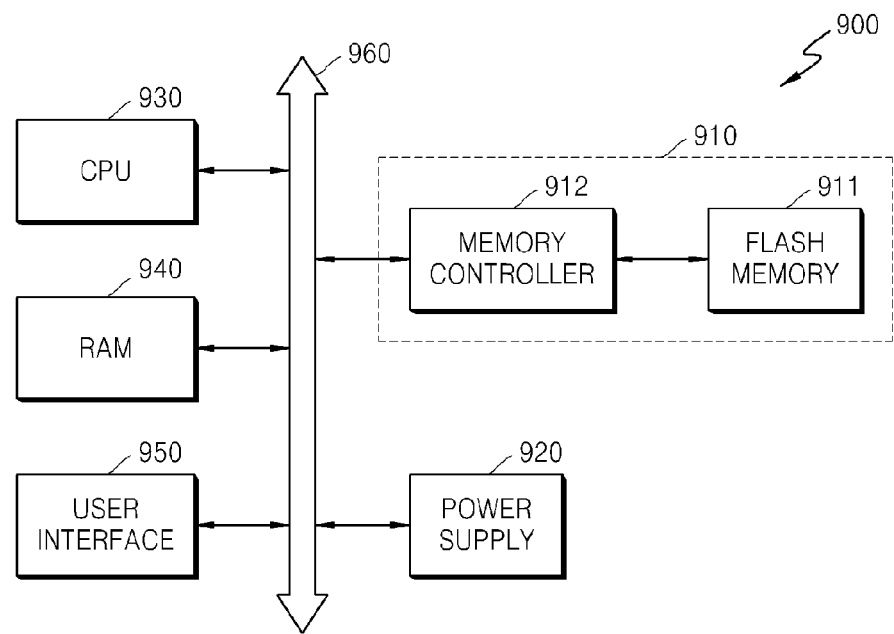
FIG. 9 is a block diagram of a computing system apparatus having a flash memory device according to an example embodiment of the inventive concept.

FIG. 9 is a block diagram of a computing system apparatus 900 having a flash memory device according to an exemplary embodiment of the inventive concept. Referring to FIG. 9, the computing system apparatus 900 may include a microprocessor 930 electrically connected to a bus 960, a user interface 950, and a flash memory system 910 including a memory controller 912 and a flash memory device 911. The flash memory device 911 may store therein N-bit data processed/to be processed by the microprocessor 930 through the memory controller 912 (N is an integer equal to or greater than 1). Furthermore, the computing system apparatus 900 according to an exemplary embodiment of the inventive concept may further include a Random Access Memory (RAM) 940 and a power supply 920.

When the computing system apparatus 900 according to an example embodiment of the inventive concept is a mobile device, the computing system apparatus 900 may additionally include a battery for supplying an operating voltage of a computing system and a modem such as a baseband chipset. In addition, since it is well known to those of ordinary skill in the art that the computing system apparatus 900 according to an example embodiment of the inventive concept may further include an application chipset, a Camera Image Processor (CIP), a mobile Dynamic RAM (DRAM), etc., a more detailed description thereof is omitted.

Preferably, the memory controller 912 and the flash memory device 911 may form, for example, a Solid State Drive/Disk (SSD) using a non-volatile memory to store data.

Figure 10:
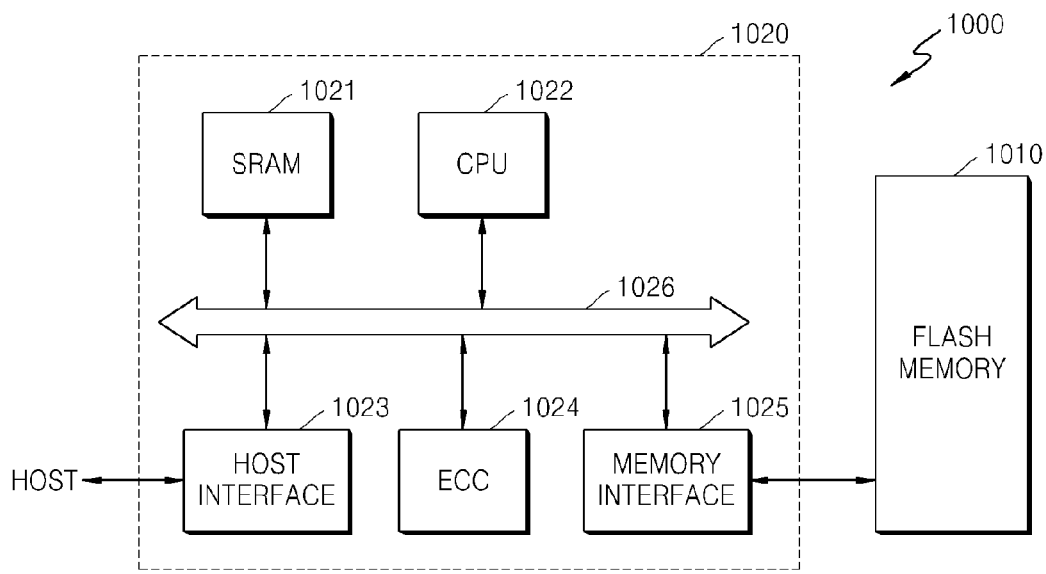
FIG. 10 is a block diagram of a memory card having a flash memory device according to an example embodiment of the inventive concept.

FIG. 10 is a block diagram of a memory card having a flash memory device according to an example embodiment of the inventive concept. As shown in FIG. 10, the flash memory device according to an example embodiment of the inventive concept may form a memory card 1000 with a memory controller 1020. In this case, the memory controller 1020 will be configured to communicate with the outside (e.g., a host) through one of various interface protocols such as Universal Serial Bus (USB), MultiMediaCard (MMC), Peripheral Component Interconnect Express (PCI-E), Serial Advanced Technology Attachment (SATA), Parallel Advanced Technology Attachment (PATA), Small Computer System Interface (SCSI), Enhanced Small-Device Interface (ESDI), and Integrated Device Electronics (IDE). Since structures and operations of a Central Processing Unit (CPU) 1022, a Static RAM (SRAM) 1021, a host interface (I/F) 1023, an Error Checking and Correction (ECC) 1024, a memory I/F 1025, and a bus 1026, which are included in the memory controller 1020 of FIG. 10, should be well understood to those of ordinary skill in the art, more detailed description thereof is omitted.

The flash memory device according to an exemplary embodiment of the inventive concept may be embedded using a package in various forms. For example, the flash memory device according to an example embodiment of the inventive concept may be embedded using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While the inventive concept has been particularly shown and described with reference to example embodiments thereof, it will be understood that various changes in form and details may be made therein without departing from the spirit and scope of the following claims.

What is claimed is:

1. A flash memory device comprising:
a memory cell array having a plurality of memory cells;
a sensing node voltage controller configured to generate a precharge voltage and a sensing node voltage control signal; and
a page buffer unit connected to the memory cell array through a plurality of bit lines and configured to receive the precharge voltage and the sensing node voltage control signal,
the page buffer unit having a plurality of page buffers respectively corresponding to the plurality of bit lines,
each of the plurality of page buffers including
a bit line connection unit connected between a corresponding bit line and a sensing node, and configured to control a voltage of the sensing node responsive to the sensing node voltage control signal,
a precharge unit connected to the sensing node, and configured to precharge the sensing node to the precharge voltage responsive to a precharge control signal, and
a data input/output unit configured to determine data of a selected memory cell by sensing the voltage of the sensing node responsive to a latch control signal, and to output the data of the selected memory cell
wherein after a precharge operation of the sensing node, the voltage of the sensing node is increased responsive to the sensing node voltage control signal before sensing the data of the selected memory cell.

2. The flash memory device of claim 1, wherein the bit line connection unit comprises at least one transistor connected in series between the corresponding bit line and the sensing node, and
a gate voltage applied to the at least one transistor is boosted after a precharge operation of the sensing node.

3. The flash memory device of claim 2, wherein the at least one transistor is directly connected to the sensing node, and a first power supply voltage is applied as the gate voltage during a precharge period and a second power supply voltage is applied as the gate voltage during a data sensing period, and
the second power supply voltage is greater than the first power supply voltage.

4. The flash memory device of claim 1, wherein the precharge voltage is greater than a power supply voltage of the flash memory device.

5. The flash memory device of claim 1, wherein the precharge unit comprises a precharge transistor having a first terminal connected to a precharge voltage supply, a second terminal connected to the sensing node, and a gate terminal connected to the precharge control signal.

6. A flash memory device comprising:
a memory cell array having a plurality of memory cells;
a sensing node voltage controller configured to generate a precharge voltage and a sensing node voltage control signal; and
a page buffer unit connected to the memory cell array through a plurality of bit lines and having a plurality of page buffers, each of the page buffers including
a bit line connection unit connected between a corresponding bit line and a sensing node, and configured to control a voltage of the sensing node responsive to the sensing node voltage control signal,
a precharge unit connected to the sensing node, and configured to precharge the sensing node to the precharge voltage responsive to a precharge control signal, and
a data input/output unit configured to determine data of a memory cell connected to the corresponding bit line by sensing the voltage of the sensing node and to output the data,
wherein during a read operation, the sensing node voltage control signal is set to a first voltage in a precharge period, and set to a second voltage after the precharge period to increase the voltage of the sensing node in a data sensing period.

7. The flash memory device of claim 6, wherein the second voltage is greater than the first voltage.

8. The flash memory device of claim 6, wherein the precharge voltage is set to a power supply voltage of the flash memory device.

9. The flash memory device of claim 8, wherein the first voltage is set to the power supply voltage.

10. The flash memory device of claim 6, wherein the precharge unit comprises a precharge transistor having a first terminal connected to a precharge voltage supply, a second terminal connected to the sensing node, and a gate terminal connected to the precharge control signal.

11. The flash memory device of claim 6, wherein the bit line connection unit comprises a plurality of transistors connected between the sensing node and the corresponding bit line, wherein a first transistor of the plurality of transistors has a first terminal connected directly to the sensing node, a second terminal connected to the corresponding bit line and a gate terminal connected to the sensing node voltage control signal.

12. A flash memory device comprising:
a memory cell array having a plurality of memory cells;
a sensing node voltage controller configured to generate a precharge voltage and a sensing node voltage control signal; and
a page buffer unit connected to the memory cell array through a plurality of bit lines, and having a plurality of page buffers, each of the page buffers including
a bit line connection unit connected between a corresponding bit line and a sensing node, and configured to control a voltage of the sensing node responsive to the sensing node voltage control signal,
a precharge unit connected to the sensing node, and configured to precharge the sensing node to the precharge voltage responsive to a precharge control signal, and
a data input/output unit configured to determine data of a memory cell connected to the corresponding bit line by sensing the voltage of the sensing node, and to output the data, wherein during a read operation, the precharge voltage is set to be greater than a power supply voltage of the flash memory device in a precharge period prior to a data sensing period.

13. The flash memory device of claim 12, wherein the sensing node voltage control signal is set to the power supply voltage during the precharge period and the data sensing period.

14. The flash memory device of claim 13, wherein the bit line connection unit comprises a plurality of transistors connected between the sensing node and the corresponding bit line, wherein a first transistor of the plurality of transistors has a first terminal connected directly to the sensing node, a second terminal connected to the corresponding bit line and a gate terminal connected to the sensing node voltage control signal.

15. The flash memory device of claim 12, wherein the precharge unit comprises a precharge transistor having a first terminal connected to a precharge voltage supply, a second terminal connected to the sensing node, and a gate terminal connected to the precharge control signal.

* * * * *